(12) United States Patent
Wilcox et al.

(10) Patent No.: US 12,219,690 B2
(45) Date of Patent: Feb. 4, 2025

(54) DAMPER SYSTEM FOR A LIDLESS INTEGRATED CIRCUIT

(71) Applicant: Arista Networks, Inc., Santa Clara, CA (US)

(72) Inventors: Robert Morris Wilcox, Saratoga, CA (US); Tiffany Doria, Fremont, CA (US); Steven Alf Hanssen, San Jose, CA (US)

(73) Assignee: Arista Networks, Inc., Santa Clara, CA (US)

( * ) Notice: Subject to any disclaimer, the term of this patent is extended or adjusted under 35 U.S.C. 154(b) by 249 days.

(21) Appl. No.: 17/462,680

(22) Filed: Aug. 31, 2021

(65) Prior Publication Data

US 2023/0067409 A1 Mar. 2, 2023

(51) Int. Cl.
*H05K 1/02* (2006.01)
*H05K 7/20* (2006.01)

(52) U.S. Cl.
CPC ....... *H05K 1/0203* (2013.01); *H05K 7/20709* (2013.01); *H05K 2201/2045* (2013.01)

(58) Field of Classification Search
CPC .... H05K 1/0203; H05K 1/181; H05K 7/2049; H05K 7/20709; H05K 2201/2045; H05K 7/20336; H05K 7/20809; H05K 7/20727
See application file for complete search history.

(56) References Cited

U.S. PATENT DOCUMENTS

| | | | | |
|---|---|---|---|---|
| 5,905,638 | A * | 5/1999 | MacDonald, Jr. | H01R 13/2414 361/767 |
| 6,607,825 | B1 * | 8/2003 | Wang | B32B 15/08 428/323 |
| 7,023,699 | B2 * | 4/2006 | Glovatsky | H05K 7/20454 361/708 |
| 7,449,775 | B1 * | 11/2008 | Ankireddi | H01L 23/433 257/E23.101 |
| 8,816,492 | B1 * | 8/2014 | Minervini | B81B 7/0077 257/787 |
| 10,107,557 | B2 | 10/2018 | Lan | |
| 10,281,220 | B1 | 5/2019 | Lin et al. | |
| 10,451,355 | B2 | 10/2019 | Lan | |
| 10,591,964 | B1 | 3/2020 | Mikjaniec et al. | |
| 10,616,993 | B1 | 4/2020 | Gawlowski et al. | |
| 10,660,236 | B2 | 5/2020 | Rush et al. | |

(Continued)

OTHER PUBLICATIONS

George Meyer, CEO, Celsia, Inc .; "A Practical Guide for Using Liquid Two-Phase Heat Sinks"; Thermal Live 2015; Oct. 12, 2015 (https://thermal.live/2015/a-practical-guide-to-using-two-phase-heat-sinks/).

(Continued)

*Primary Examiner* — Adam B Dravininkas
(74) *Attorney, Agent, or Firm* — Tianyi He

(57) ABSTRACT

A processing unit. The processing unit includes a printed circuit board (PCB) including a lidless integrated circuit, a heatsink, and a damper system. The heatsink is coupled to the PCB and in thermal communication with the lidless integrated circuit via a thermal interface material. The damper system is compressed between the PCB and the heatsink and surrounding the lidless integrated circuit to absorb a portion of kinetic energy imparted to the lidless integrated circuit by an impact to the processing unit.

15 Claims, 6 Drawing Sheets

(56) References Cited

U.S. PATENT DOCUMENTS

| | | | | |
|---|---|---|---|---|
| 2001/0038527 | A1* | 11/2001 | DiBene, II | G06F 1/18 |
| | | | | 361/719 |
| 2003/0024781 | A1* | 2/2003 | Iannuzzelli | H01L 23/4006 |
| | | | | 257/E23.084 |
| 2004/0212963 | A1* | 10/2004 | Unrein | H01L 23/4006 |
| | | | | 257/E23.084 |
| 2005/0003585 | A1* | 1/2005 | Combs | H01L 23/3128 |
| | | | | 257/E23.092 |
| 2008/0053640 | A1* | 3/2008 | Mok | F28D 15/02 |
| | | | | 257/E23.091 |
| 2010/0188811 | A1 | 7/2010 | Liang | |
| 2013/0112459 | A1* | 5/2013 | Aoshima | B32B 27/20 |
| | | | | 428/435 |
| 2013/0112460 | A1* | 5/2013 | Aoshima | H05K 1/0306 |
| | | | | 428/435 |
| 2016/0165757 | A1* | 6/2016 | Norton | H05K 7/20336 |
| | | | | 29/890.032 |
| 2016/0374232 | A1* | 12/2016 | Chia | F16B 5/0266 |
| 2018/0288908 | A1* | 10/2018 | Lee | H05K 9/0031 |
| 2018/0374714 | A1* | 12/2018 | Stathakis | H01L 23/367 |
| 2018/0374716 | A1* | 12/2018 | Stathakis | H01L 21/56 |
| 2019/0013291 | A1* | 1/2019 | Strader | H01L 24/97 |
| 2019/0297724 | A1* | 9/2019 | Chiu | H05K 1/181 |
| 2022/0216127 | A1* | 7/2022 | Osenbach | H01L 23/3672 |

OTHER PUBLICATIONS

George Meyer, CEO, Celsia, Inc.; "Heat Pipes & Vapor Chambers: Design Guidelines"; Thermal Live 2016; Oct. 4, 2016 (https://semi-therm.org/wp-content/uploads/2017/04/Heat-Pipe-Vapor-Chamber-Heat-Sink-Design-Guidelines-Thermal-Live-2016.pptx.pdf).

International Search Report and Written Opinion mailed Sep. 15, 2021 for corresponding PCT Application No. PCT/US2021/020087.

\* cited by examiner

DAMPER SYSTEM FOR A LIDLESS INTEGRATED CIRCUIT

BACKGROUND

In some compact computing environments, there may be a limited amount of open physical space to place additional components. Accordingly, there may be difficulty in designing compute units to fit within the given space constraints. In such scenarios, it may be desirable to design compute units that efficiently use the existing space.

DETAILED DESCRIPTION

Figure 1:
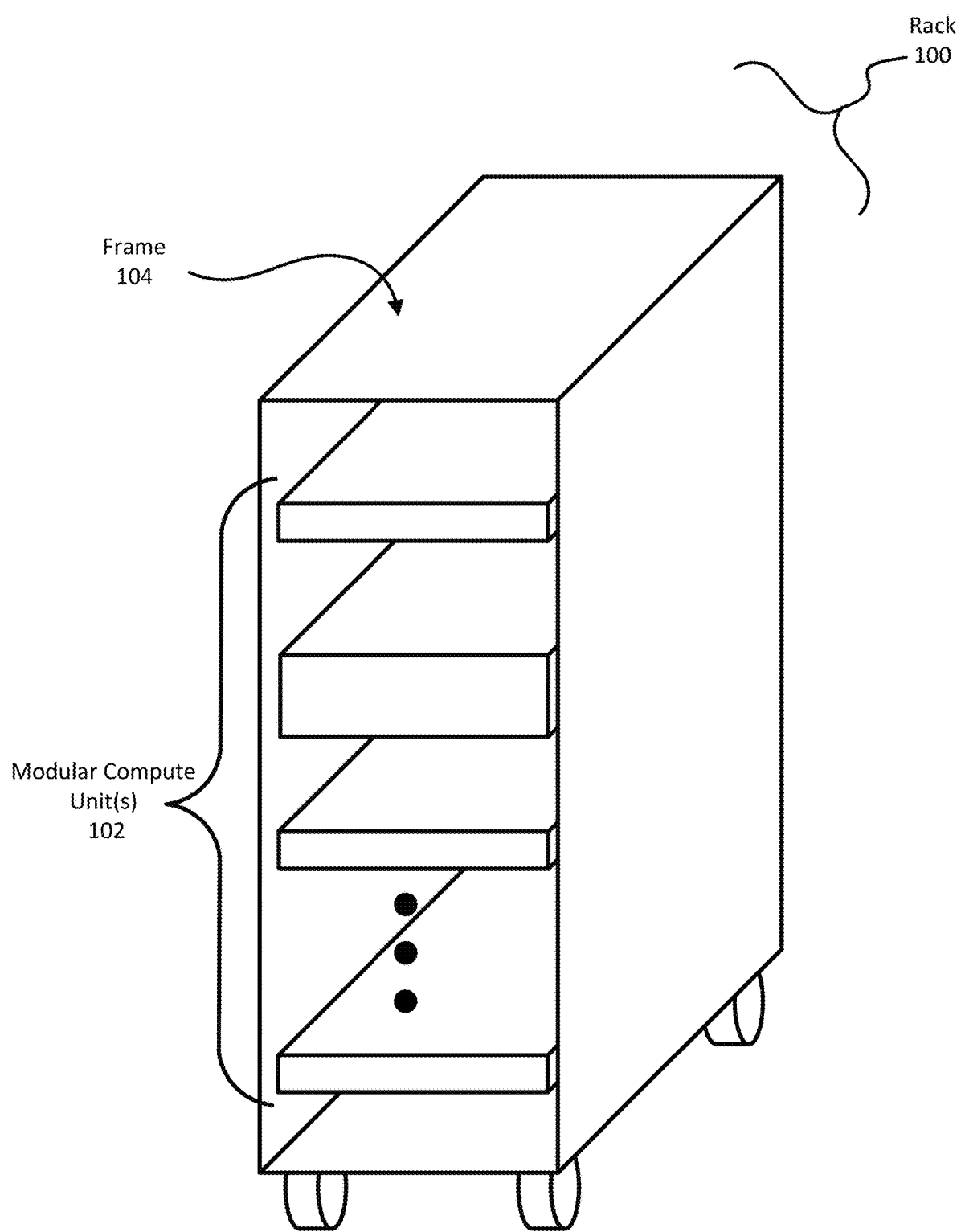
FIG. 1 shows an example rack, in accordance with one or more embodiments.

In conventional processing units, integrated circuits (e.g., processors, application specific integrated circuits (ASICs), field programmable gate arrays (FPGAs), etc.) often operate most efficiently within a certain temperature range. However, due to their significant power usage, integrated circuits generate considerable heat and rise to a temperature beyond that ideal range, often forcing the integrated circuit to sacrifice performance by reducing power to avoid damage from heat. Thus, integrated circuits are often coupled to a heatsink that removes heat from the integrated circuit, thereby allowing operation at a desired temperature and power level.

However, as integrated circuits become more computationally powerful, more power is drawn to support that additional performance, and consequently heat is generated at ever higher rates. Thus, a problem arises when existing heatsinks cannot remove heat at a sufficient rate and the integrated circuit begins to operate outside of the preferred temperature range (in turn reducing power consumption and sacrificing performance). Further, this problem is exacerbated when the physical constraints of the computing system do not allow for insertion of additional heatsinks.

That is, depending on the constraints of the computing system, certain types of heatsinks may be suitable or unsuitable to regulate the temperature of an integrated circuit. For example, in an open and accessible environment, a forced liquid cooling system may be utilized for rapid heat removal. Whereas, in an environment that lacks ample free space and/or requires low maintenance components—heatsinks may be utilized due to their low maintenance reliability and suitability for small and hard-to-access areas. Non-limiting examples of a heatsink include fins (one or more elongated and conductive structures that protrude into the surrounding fluid), cavities (indentations and/or holes allowing a surrounding fluid to fill the interstitial space of those cavities), and/or plates (flat surfaces exposed to the surrounding fluid). One of ordinary skill in the art, having the benefit of this Detailed Description, would appreciate that heatsinks may take the form of any passive heat exchanger.

Additionally, in some applications, a lidded integrated circuit includes a lid that covers and protects the integrated circuit. The integrated circuit is in thermal communication with integrated circuit via a first thermal interface material and a heatsink is in thermal communication with the lid via a second thermal interface material. However, the lid and additional layer of thermal interface material impose additional layers of material between the integrated circuit and the heatsink, reducing the performance of the heatsink. In other applications, the integrated circuit package does not include a lid and the heatsink is in thermal communication with integrated circuit via only one thermal interface material. While this configuration offers better thermal performance than an integrated circuit that uses a lid, the die is more susceptible to damage due to improper installation of the heatsink and/or shock events after installation of the heatsink.

To address one or more of the aforementioned problems, one or more embodiments described herein provides a damper that is installed between a heatsink and a lidless integrated circuit. More specifically, in one or more embodiments, the damper is placed between a printed circuit board ("PCB") of the integrated circuit package or a stiffener attached to the PCB and the heatsink and then compressed as the heatsink is installed. The addition of the damper reduces the risk of damaging the integrated circuit when mounting the heatsink to the integrated circuit, while still offering improved thermal performance when compared to a lidded integrated circuit. Further, once installed between the heatsink and the integrated circuit, the damper provides shock absorption to reduce the risk of damaging the integrated circuit during a shock event.

FIG. 1 shows an example rack in accordance with one or more embodiments. A rack (e.g., rack (100)) may include a frame (e.g., frame (104)) and one or more modular compute unit(s) (e.g., modular compute unit(s) (102), which may be referred to as a "compute unit" generally herein). One or more components of the rack (100) and/or the frame (104) may include components that enable the ability to mount one or more modular compute unit(s) (102) to the frame (104). In general, the rack (100) may be configured to accept one or more modular compute unit(s) (102) of a standardized height (e.g., a "rack unit" (RU)) or some multiple thereof. Further, to utilize space more efficiently within the rack (100), the gaps between the modular compute units (102) may be minimized thereby creating a more compact hardware environment. Further, by creating standardized units of height for the modular compute units (102), design of the module compute unit(s) (102) may be specifically tailored to optimize a standard constrained geometry (i.e., avoid using only a small portion of an adjacent space) thereby allowing for compact placement among equipment of different manufacturers. By doing so, the modular compute unit(s) (102) may be assembled in a high-density computing environment.

In one or more embodiments, a frame (e.g., frame (104)) is the outer structure of the rack (100) and may be constructed using any number of suitable materials. As non-limiting examples, some or all of the frame (104) may be constructed using metals (e.g., steel, aluminum, etc.), polymers (e.g., polyamides, polycarbonates, polyester, polyethylene, polypropylene, polystyrene, polyurethanes, polyvinyl chloride, etc.), and/or elastomer (e.g., latex, styrene-butadiene elastomers, etc.). One of ordinary skill in the art, having the benefit of this Detailed Description, would appreciate that the frame (104) may be implemented using any quantity and combination of suitable materials without departing from the scope.

To facilitate mounting of one or more modular compute unit(s) (102), the frame (104) may include any number of structural members (e.g., beams, brackets, bars, etc.) and any number of mechanical mounting points (e.g., holes, threaded portions, etc.) disposed on the structural members to facilitate storage of one or more modular compute unit(s) (102). Different structural members may have different shapes, sizes, and/or other physical characteristics. The shapes, sizes, and/or other physical characteristics of the structural members may be adapted to enable the structural members to be mechanically connected (e.g., permanently connected or detachably connected) to other structural members to form a predetermined structure. The predetermined structure may be, for example, a cage, box, or other type of structure that facilitates positioning and/or orienting one or more modular compute unit(s) (102).

While FIG. 1 shows a rack according to one or more embodiments, other configurations may be used without departing from the scope. For example, although illustrated as including a limited number of components, the rack (100) may include any number of frames (e.g., frame (104)), modular compute unit(s) (e.g., modular compute unit(s) (102)), and/or other components without departing from the scope. Accordingly, embodiments disclosed herein should not be limited to the configuration of devices and/or components shown in FIG. 1.

Figure 2:
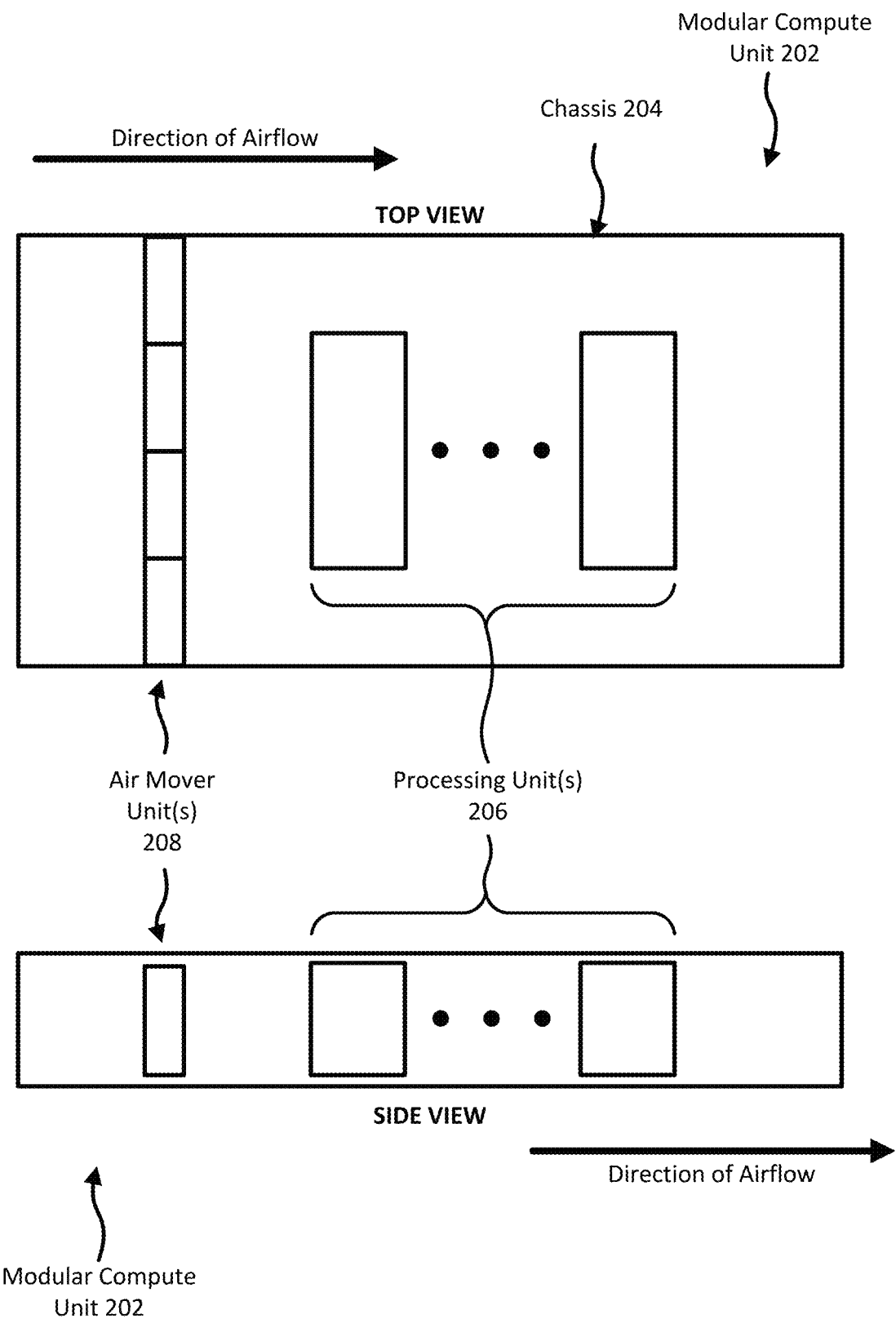
FIG. 2 shows an example modular compute unit, in accordance with one or more embodiments.

FIG. 2 shows an example modular compute unit, in accordance with one or more embodiments. Specifically, FIG. 2 shows a top view and side view of a modular compute unit (e.g., modular compute unit (202)) and one or more component(s) therein. In one or more embodiments, a modular compute unit (e.g., modular compute unit (202)) is physical structure that includes an empty volume suitable to include one or more processing unit(s) (e.g., processing unit(s) (206)) and one or more air mover unit(s) (e.g., air move unit(s) (208)).

In one embodiment, a chassis (e.g., chassis (204)) forms the exterior structure of the modular compute unit (202). A chassis (204) may be a mechanical structure that is adapted to (i) facilitate attachment of the modular compute unit (202) to a frame of a rack (as discussed in the description of FIG. 1), (ii) house the processing unit(s) (206) and/or the air mover unit(s) (208), (iii) provide electrical (power and/or data) operative connection(s) to the processing unit(s) (206), and/or (iv) provide thermal management services to the processing unit(s) (206) of the modular compute unit (202) (e.g., via the air mover unit(s) (208)). More detail regarding the description of the processing unit (206) and the components therein is provided in the description of FIGS. 3A-4B.

The chassis (204) of the modular compute unit (202) may be constructed using any number of suitable materials. As non-limiting examples, some or all of the chassis (204) of the modular compute unit (202) may be constructed using metals (e.g., steel, aluminum, etc.), polymers (e.g., polyamides, polycarbonates, polyester, polyethylene, polypropylene, polystyrene, polyurethanes, polyvinyl chloride, etc.), and/or elastomer (e.g., latex, styrene-butadiene elastomers, etc.). One of ordinary skill in the art, having the benefit of this Detailed Description, would appreciate that the chassis of the modular compute unit (202) may be implemented using any quantity and combination of suitable materials without departing from the scope.

In one embodiment, a modular compute unit (202) provides electrical power (e.g., power) to the processing unit(s) (206) and the air mover units(s) (208) via one or more electrically conductive operative connection(s) (e.g., metallic contacts and/or wire(s) terminated with a plug and socket). The modular compute unit (202) may be provided power from a rack (not shown) or via some other source.

To provide thermal management services to the processing unit(s) (206) and/or other devices, the modular compute unit (202) may facilitate the flow of gas proximate to the processing unit(s) (206) and/or other devices via the air mover unit(s) (208). By doing so, the thermal state (i.e., temperature) of the aforementioned devices may be regulated (i.e., maintained within a preferred temperature range). As a non-limiting example, the modular compute unit (202) may include one or more vents that allow gaseous matter (e.g., air) to flow into a first side of the modular compute unit (202), through the modular compute unit (202) via the air mover unit(s) (208), and out a second side of the modular compute unit (202). The gas, flowing through the modular compute unit (202), may be at a different temperature than the processing unit(s) (206) and/or other devices. Consequently, thermal exchange between the flow of the gaseous matter and the aforementioned devices may occur resulting in the temperature of the aforementioned devices changing. By doing so, heat generated by the aforementioned devices may be expelled from the devices thereby regulating the temperature of the aforementioned devices.

While FIG. 2 shows an example of modular compute unit (202), other configurations may be used without departing from the scope. Accordingly, embodiments disclosed herein should not be limited to the configuration of devices and/or components shown in FIG. 2.

Figure 3A:
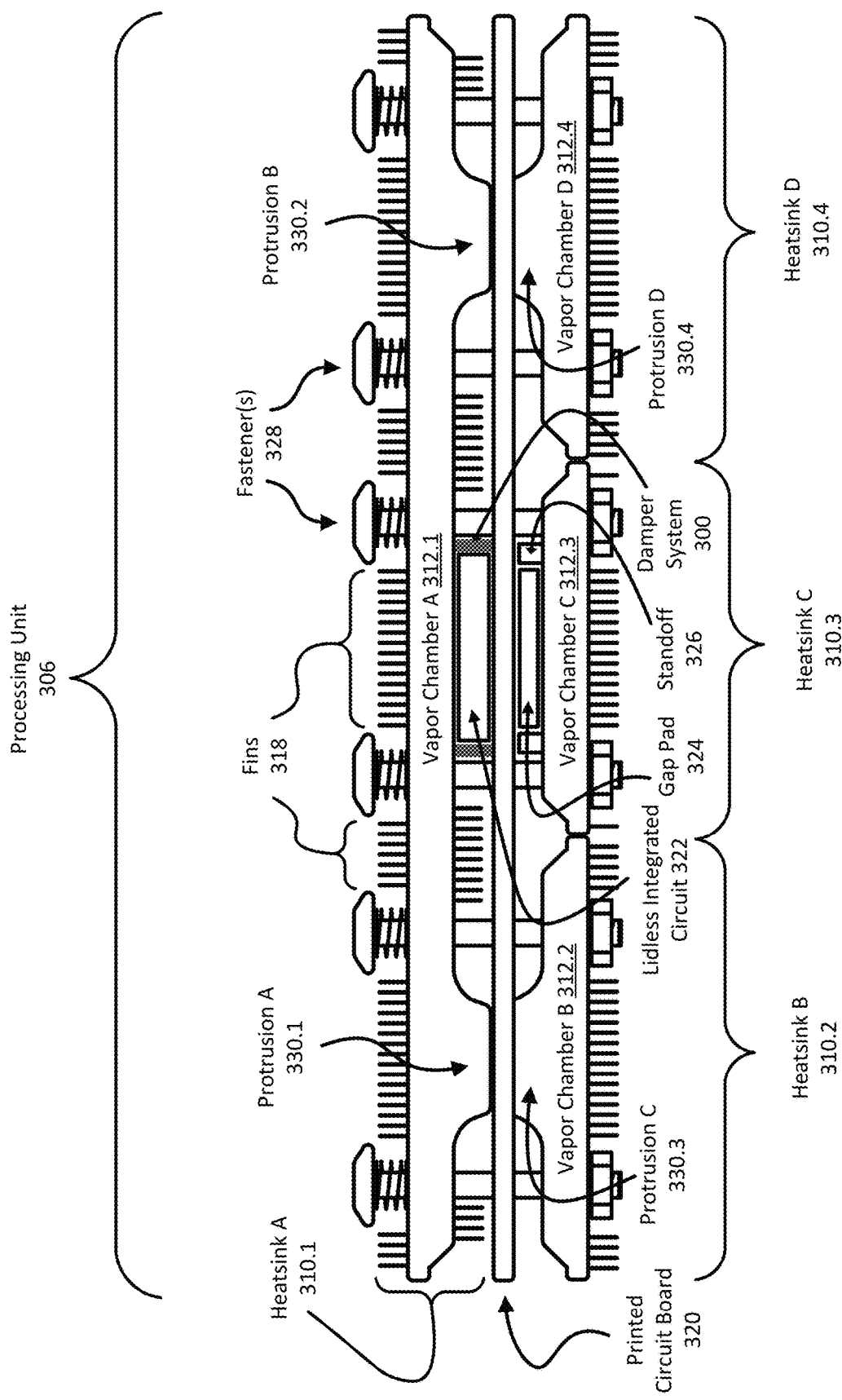
FIG. 3A shows an example of a processing unit, in accordance with one or more embodiments.

FIG. 3A shows an example of a processing unit (e.g., processing unit (306)), in accordance with one or more embodiments. In one or more embodiments, the processing unit (306) includes a PCB (e.g., PCB (320)) thermally coupled to one or more heatsink(s) (e.g., heatsink A (310.1), heatsink B (310.2), heatsink C (310.3), heatsink D (310.4)) and one or more fastener(s) (e.g., fastener(s) (328)) that mechanically couple the components together. The processing unit (306) also includes a damper system (e.g., damper system 300) that is positioned between the PCB (320) and heatsink A (310.1) and that surrounds a lidless integrated circuit (e.g. integrated circuit 322). Further, in one or more embodiments, processing unit (306) may include several similarly constructed heatsinks (e.g., heatsink B (310.2) and heatsink D (310.4)) as shown in FIG. 3A. Each of these components is described below.

In one or more embodiments, the PCB (320) is a structure that provides mechanical attachment and electrically conductive pathways to one or more electrical components mounted thereon (e.g., the lidless integrated circuit (322)). In one or more embodiments, the PCB (320) may be constructed of several layers that provide electrically conductive pathways surrounded by non-electrically conductive material (i.e., insulators). In one or more embodiments, the PCB (320) is interposed between two or more heatsinks (310.1, 310.2, 310.3, 310.4) and may include one or more through holes (not shown) to allow one or more respective protrusions (330.1, 330.2, 330.3, 330.4) (described below) to traverse the thickness of the PCB (320).

In one or more embodiments, the lidless integrated circuit (322) is a combination of two or more electronic circuits packaged onto a single electronic chip. Non-limiting examples of types of an integrated circuit (e.g., the lidless integrated circuit 322) include processors (in the form of cores and/or micro-cores), storage devices (e.g., flash memory, random access memory (RAM), dynamic RAM (DRAM), resistive RAM (ReRAM), Content Addressable Memory (CAM), Ternary CAM (TCAM), etc.), configurable and/or configured circuits (e.g., application specific integrated circuits (ASICs), field programmable gate arrays (FPGAs)). Further, in one or more embodiments, the integrated circuit (322) may combine one or more circuit-based devices onto a single chip (e.g., an advanced reduced instruction set computer (RISC) machine (ARM) processor core combined with an ASIC). One of ordinary skill in the art, having the benefit of this Detailed Description, would appreciate that that a lidless integrated circuit (e.g., lidless integrated circuit (322)) may take several forms and be used for any suitable purpose.

In one or more embodiments, a heatsink (e.g., heatsink A (310.1), heatsink B (310.2), heatsink C (310.3), heatsink D (310.4)) is a device that removes heat from a hot component (e.g., integrated circuit (322) and/or other heatsinks (e.g., 310.1, 310.2, 310.3, 310.4)). In one or more embodiments, the heatsink (310.1, 310.2, 310.3, 310.4) removes heat from a hot component via thermally conductive contact and dissipates the heat to the surrounding environment (e.g., via forced convection caused by one or more air mover unit(s) (not shown) external to the processing unit (306)).

In one or more embodiments, the heatsinks (310.1, 310.2, 310.3, 310.4) may be a composite device that includes one or more heat transfer devices, including a vapor chamber (e.g., vapor chamber A (312.1), vapor chamber B (312.2), vapor chamber C (312.3), vapor chamber D (312.4)) and fins (e.g., fins (318)), in addition to structural elements that enable mechanical and/or thermally conductive coupling to other components, including one or more standoff(s) (e.g., standoff (326)) and a gap pad (e.g., gap pad (324)). Each of these components is described below.

In one or more embodiments, the vapor chamber (e.g., vapor chamber A (312.1), vapor chamber B (312.2), vapor chamber C (312.3), vapor chamber D (312.4)) is a passive heat exchanger that includes an internal volume that provides an isolated environment for fluid heat transfer. In one or more embodiments, a vapor chamber (e.g., 312.1, 312.2, 312.3, 312.4) is a heat pipe that includes a porous wick and a fluid that cyclically transitions from liquid to gas and back to liquid while removing heat from a component (e.g., the lidless integrated circuit (322) in thermal communication with vapor chamber A (312.1) via a thermal interface material (not shown)) and/or other heatsinks (e.g., 310.1, 310.2, 310.3, 310.4)). In one or more embodiments, the exterior of vapor chamber (312.1, 312.2, 312.3, 312.4) is constructed using a rigid thermal conductor (e.g., any solid metal (e.g., copper)), a rigid thermal conductor that is also an electrical insulator (e.g., certain ceramics, diamond, etc.), and/or a semi-rigid (e.g., flexible, ductile, malleable, etc.) composite material that combines one or more materials (e.g., silicone polymers with dispersed ceramic particles) and allows for electrical insulation, thermal conduction, and ductility.

In one or more embodiments, a vapor chamber (e.g., 312.1, 312.2, 312.3, 312.4) is constructed to allow the internal fluid, when in liquid form, to flow nearest the hot component (e.g., the lidless integrated circuit (322)) where heat is thermally transferred from the hot component to the liquid, thereby causing the liquid fluid to vaporize into a gaseous fluid. In turn, the gaseous fluid circulates through the vapor chamber (e.g., 312.1, 312.2, 312.3, 312.4) to a comparatively colder (i.e., less hot) location where the gaseous vapor is cooled back into the liquid phase of matter (e.g., heat may be removed via fins (318) thermally coupled to the exterior of the vapor chamber). Once the fluid is again in liquid form, the vapor chamber (e.g., 312.1, 312.2, 312.3, 312.4) is constructed to allow the liquid fluid to flow back to the internal portion of the vapor chamber nearest the hot component (e.g., either by gravity and/or through the capillary action of the porous wick lining the vapor chamber). Once near the hot component, the liquid may vaporize into a gas again, thereby repeating the heat exchange cycle. One of ordinary skill in the art, having the benefit of this Detailed Description, would appreciate the basic function and design of vapor chambers (e.g., 312.1, 312.2, 312.3, 312.4) and/or heat pipes generally.

In one or more embodiments, a damper system (300) is positioned between the PCB (320) and vapor chamber A (312.1) and surrounds the lidless integrated circuit (322). The damper system (300) is compressed between the PCB (320) and vapor chamber A (312.1) when heatsink A (310.2) is installed on the processing unit (306). Since the damper system (300) is compressed between vapor chamber A (312.1) and the PCB (320), the damper system (300) will absorb a portion of the kinetic energy imparted by an impact to the processing unit (306), thereby reducing the amount of kinetic energy received by the lidless integrated circuit (322) through heatsink A. By reducing the amount of kinetic energy received by the lidless integrated circuit (322), the damper system (300) makes the lidless integrated circuit less susceptible to damage due to impacts to the processing unit (306). Additionally, since the damper system (300) must be compressed as heatsink A is installed on the processing unit (306), the damper system (300) reduces the likelihood that lidless integrated circuit (322) is damaged due to too much force being imparted by the installation of heatsink A.

In some embodiments, the thickness of the damper system (300) may be within a range between approximately 1 mm and approximately 10 mm. However, other embodiments may include damper systems that are thinner than 1 mm or thicker than 10 mm. Further, the damper system (300) may be formed by coupling multiple layers of materials together and/or by joining or placing multiple sections of materials on the PCB (320). In some embodiments, the materials of each layer or section of the damper system (300) are the same material. In other embodiments one or more layers or sections of the damper system (300) may be made of a different material than the other layers or sections.

As non-limiting examples, some or all of the damper system (300) may be constructed using metals (e.g., steel, aluminum, etc.), polymers (e.g., polyamides, polycarbonates, polyester, polyethylene, polypropylene, polystyrene, polyurethanes, polyvinyl chloride, etc.), and/or elastomer (e.g., latex, styrene-butadiene elastomers, etc.). As a non-limiting example, in one or more embodiments, the portions of the damper system (300) that contact the PCB (322) and vapor chamber A (312.1) may be an elastomer material and a metal material may be disposed between the portions of elastomer material to provide additional stiffness to the damper system (300). As another non-limiting example, in one or more embodiments, the damper system (300) may be formed from an elastomer that includes metallic particles to offer EMI protection to the lidless integrated circuit (322).

In one or more embodiments, a vapor chamber (e.g., 312.1, 312.2, 312.3, 312.4) includes one or more protrusions (e.g., protrusion A (330.1), protrusion B (330.2), protrusion C (330.3), protrusion D (330.4)). In one or more embodiments, a protrusion (e.g., protrusion A (330.1), protrusion B (330.2), protrusion C (330.3), protrusion D (312.4)) is a physical protuberance (i.e., bulge, bump, projection, etc.) that elongates a portion of the vapor chamber (e.g., 312.1, 312.2, 312.4) in a particular direction. In one or more embodiments, protrusion (330.1, 330.2, 330.3, 330.4) may be used to provide thermal coupling between two or more heatsinks (e.g., 310.1, 310.2, 310.4) (and/or vapor chambers (312.1, 312.2, 312.4) thereof).

As a non-limiting examples, as shown in FIG. 3A, protrusion A (330.1) extends downwards and makes physical contact and thermally conductive coupling with protrusion C (330.3). Accordingly, via the thermally conductive coupling of protrusion A (330.1) with protrusion C (330.3), vapor chamber A (312.1) is accordingly thermally coupled to vapor chamber B (312.2) (also thermally coupling heatsink A (310.1) to heatsink B (310.2)). Further, as shown in FIG. 3A, vapor chamber A (312.1) may include two protrusions (protrusion A (330.1) and protrusion B (330.2)) each making independent contact with two unique protrusions (protrusion C (330.3) and protrusion D (330.4), respectively) of two unique vapor chambers (vapor chamber B (312.2) and vapor chamber D (312.4), respectively).

In one or more embodiments, one or more protrusions(s) (e.g., 330.1, 330.2) may contact other protrusion(s) (e.g., 330.3, 330.4) at different heights. As a non-limiting example, protrusion A (330.1) and protrusion B (330.2) may not elongate as much as protrusion C (330.3) and protrusion D (312.4) such that the protrusions make thermally conductive contact above the surface of PCB (320) (i.e., closer to the inner surface of heatsink A (310.1) than the other heatsinks (310.2, 310.3, 310.3)). Conversely, as another non-limiting example, protrusion C (330.3) and protrusion D (312.4) may not elongate as much as protrusion A (330.1) and protrusion B (330.2) causing the thermally conductive contact between the protrusions (330.1, 330.2, 330.3, 330.4) to occur below PCB (320). One of ordinary skill in the art, having the benefit of this Detailed Description, would appreciate that opposing protrusions (e.g., 330.1 and 330.3, 330.2 and 330.4) may contact each other at any height between the heatsink inner surfaces (e.g., above or below PCB (320), parallel to either surface of PCB (320), and/or within the thickness of the PCB (320) (i.e., in a through hole)).

As another non-limiting example, one or more vapor chamber(s) (e.g., 312.1) may not include any protrusions (e.g., 330.1, 330.2) such that the opposite protrusions (e.g., 330.3, 330.4) may extend further (e.g., twice as far) towards the opposing heatsink (e.g., 312.1) in order to make thermally conductive contact. Further, as a non-limiting example, processing unit (306) may not include any protrusions (330.1, 330.2, 330.3, 330.4) on any vapor chamber (312.1, 312.2, 312.3, 312.4). In such a scenario, additional conductive components (not shown) may be inserted between opposing heatsinks (e.g., 310.1, 310.2, 310.4) so that thermally conductive contact may be achieved. For example, a solid conductive component (e.g., a copper block) may be disposed between the bottom surface of vapor chamber A (312.1) and the top surface of vapor chamber B (312.2) (if neither includes a protrusion) in order to provide thermally conductive contact between heatsink A (310.1) and heatsink B (310.2). In one or more embodiments, an additional conductive component that is disposed between opposing heatsinks (e.g., 310.1, 310.2, 310.4) may be soldered to the inner surface of one or more heatsink(s) or may be held in place via the compression exerted by the fastener(s) (328).

As shown in FIG. 3A, the integrated circuit (322) is in thermal communication with heatsink A (310.1) via a thermal interface material; accordingly, heatsink A (310.1) may absorb more heat from the integrated circuit (322) than heatsink B (310.2), heatsink C (310.3), and/or heatsink D (310.4). Accordingly, in one or more embodiments, heatsink A (310.1) (and/or vapor chamber A (312.1) thereof) may lose efficiency due to an inability to remove heat at a sufficient rate in the absence of additional heatsinks (e.g., if heatsinks B, C, and D (310.2, 310.3, 310.4) were absent). Thus, when heatsink B (312.2) is thermally coupled via protrusions A and C (330.1 and 330.3), additional heat may be dissipated from heatsink A (310.1) allowing for greater heat removal efficiency of the integrated circuit (322).

Similarly, in one or more embodiments, as shown in FIG. 3A, heatsink C (310.3)—located directly under the portion of the PCB (320) holding the lidless integrated circuit (322)—may also become hotter than heatsinks B and D (310.2, 310.4). Thus, heatsink B (310.2) and heatsink D (310.4) may be thermally coupled to heatsink C (310.3) thereby also indirectly removing heat via a lateral physical contact (created when fastener(s) (328) mechanically couple the components of the processing unit (306)).

In one or more embodiments, a single protrusion (e.g., protrusion A (330.1)) may be thermally and conductively couple with another vapor chamber (e.g., vapor chamber B (312.2)) without contacting a second protrusion (e.g., protrusion C (330.3) may be absent). In such an embodiment, protrusion A (330.1) may be elongated more than shown in FIG. 3A (i.e., protruding further vertically downward), in order to physically contact vapor chamber B (312.2).

In one or more embodiments, the fins (318) are a passive heat exchanger that absorbs heat from a thermally coupled component and dissipates that heat into a surrounding fluid (e.g., surrounding air). The fins (318) may be constructed to maximize surface area with a surrounding fluid to maximize the efficiency of heat removal from the fin. In one or more embodiments, the fins (318) are constructed using a rigid thermal conductor (e.g., any solid metal (e.g., copper)), a rigid thermal conductor that is also an electrical insulator (e.g., certain ceramics, diamond, etc.), and/or a semi-rigid (e.g., flexible, ductile, malleable, etc.) composite material that combines one or more materials (e.g., silicone polymers with dispersed ceramic particles) and allows for electrical insulation, thermal conduction, and ductility. In one or more embodiments, the fins (318) may be placed on any exterior surface of the vapor chamber(s) (312.1, 312.2, 312.3, 312.4) and may be oriented to maximize interstitial gaseous flow caused by an air mover unit (not shown).

In one or more embodiments, a standoff (e.g., standoff (326)) is a structural elements that allows for the mechanical coupling of a PCB (e.g., 320) to a heatsink (e.g., heatsink C (310.3)). In one or more embodiments, the standoff (326) is a receptacle for a corresponding mechanical fastener (not shown). As a non-limiting example, the standoff(s) (326) may include an internal threaded cylindrical volume that accepts a machine screw and/or bolt to be threaded into the standoff (326). Accordingly, as shown in FIG. 3A, the PCB (320) may be mounted to the standoff (326) via a machine screw configured to pass through the PCB (320) and thread into the standoff (326).

In one or more embodiments, a gap pad (e.g., gap pad (324)) is a thermally conductive structure that fills a void created between the PCB (320) and heatsink C (310.3). In one or more embodiments, the gap pad (324) may be constructed of any material that increases the thermal conductivity between two devices. As non-limiting examples, the gap pad (324) may be constructed of any rigid thermal conductor (e.g., any solid metal (e.g., copper)), rigid thermal conductors that are also electrical insulators (e.g., certain ceramics, diamond, etc.), and/or semi-rigid (e.g., flexible, ductile, malleable, etc.) composite materials that combine one or more materials (e.g., silicone polymers with dispersed ceramic particles) and allows for electrical insulation, thermal conduction, and ductility.

In one or more embodiments, a void (e.g., a volume that includes the surrounding fluid matter of the environment, an "air-filled void") is created between the PCB (320) and one or more heatsinks (310.1, 310.2, 310.3, 310.4) as the PCB (320) may be mounted using structural elements (i.e., the standoff(s) (326)) that offset the PCB (320) away from one or more heatsink (310.1, 310.2, 310.3, 310.4). To fill a void and provide thermal conductive coupling between the PCB (320) and the heatsink (e.g., 310.1, 310.2, 310.3, 310.4), the gap pad (324) may be disposed in the void to fill and/or eliminate the void and also provide thermally conductive contact to the surrounding components.

As a non-limiting example, as shown in FIG. 3A, the PCB (320) is mounted to heatsink C (310.3) via one or more standoff(s) (326); accordingly, the height of standoff(s) (326) displaces the PCB (320) away from vapor chamber C (312.3) thereby creating an air-filled void between the PCB (320) and vapor chamber C (312.3) (in the absence of gap pad (324)). However, as heatsink C (310.3) is placed below the PCB (320) in order to remove heat from integrated circuit (322), such an air-filled void reduces the effectiveness of vapor chamber C (312.3) (and heatsink C (310.3) as a whole) because the air-filled void is not as thermally conductive as direct conductive contact through solid matter. Accordingly, to increase the thermally conductive coupling between the PCB (320) and heatsink C (310.3), gap pad (324) is placed therebetween to allow for increased heat removal from the PCB (320) (and the lidless integrated circuit (322) directly above). In one or more embodiments, heatsink C (310.3) (and vapor chamber C (312.3) thereof) is against the PCB (320) directly opposite the lidless integrated circuit (322) and may remove heat from the lidless integrated circuit (322) via one or more conductive pathways (e.g., through silicon vias (TSVs)) that traverse the PCB (320).

In one or more embodiments, a fastener (e.g., fastener(s) (328)) is hardware that provides means for mechanically coupling one component to another component. Non-limiting examples of the fastener(s) (328) include rigid fasteners (e.g., screws, machine screws, bolts, nuts, nails, pins, cable ties, etc.), semi-rigid fasteners (e.g., adhesive tape, hook-and-loop fasteners, glue, etc.), rigid fasteners that allow for limited movement (e.g., links/chains, ball-and-socket connections, hinges). As shown in FIG. 3A, the fastener(s) (328) may be a nut-and-bolt type of rigid mechanical fastener that, when tightened (stressing the fastener), provides compression to the other components of the processing unit (306).

In one or more embodiments, the fastener (e.g., 328) may be used to mechanically couple two components and provide pressure to bilateral sides of a third component disposed therebetween. As a non-limiting example, as shown in FIG. 3A, the PCB (320) (and damper system (300) and the lidless integrated circuit (322) disposed thereon) are compressed between vapor chamber A (312.1) and gap pad (324) via the tightening of the fastener(s) (238) that mechanically couple heatsink A (310.1) to heatsink C (310.3). Accordingly, although the PCB (320), the lidless integrated circuit (322), the damper system (300), and the gap pad (324) are not indirect contact with any fastener (328), those components are nonetheless mechanically coupled via the pressure created by the fastener(s) (328) on the surrounding heatsinks A and C (310.1, 310.3).

Similarly, as a non-limiting example, as shown in FIG. 3A, pairs of protrusions (e.g., protrusion A (330.1) and protrusion C (330.3); and protrusion B (330.2 and protrusion D (330.4)) are mechanically coupled (pressured together) through the compressive inward force exerted when the fastener(s) (328) are manipulated (e.g., tightened) to cause greater pressure on the exterior surfaces of the vapor chambers (312.1, 312.2, 312.3, 312.4).

In one or more embodiments, a thermal interface material (not shown) is placed between the physical contacts of any two components that are thermally conductively coupled. The thermal interface material may fill any voids that may be created via an imperfect physical coupling, thereby increasing physical contact, thermal conductivity, and overall heat transfer efficiency. As non-limiting examples, thermal interface material may be placed between the integrated circuit (322) and vapor chamber A (312.2), protrusion A (330.1) and protrusion C (330.3), vapor chamber B (312.2) and vapor chamber C (312.3), and any vapor chamber (310.1, 310.2, 310.3, 310.4) and fins (318). In one or more embodiments, thermal paste includes thermally conductive materials (e.g., aluminum oxide, boron nitride, zinc oxide, aluminum nitride, etc.) suspended in an electrically insulated matrix (e.g., epoxies, silicones, urethanes, acrylates, etc.).

While FIG. 3A shows an example of a processing unit, other configurations may be used without departing from the scope. For example, although FIG. 3A shows four separate heatsinks (e.g., 310.1, 310.2, 310.3, 310.4) mechanically and thermally coupled to a PCB (e.g., 320), the lower three heatsinks (310.2, 310.3, 310.4) may, instead, be a single heatsink that spans the length of the processing unit and is shaped similar to heatsink A (310.1) (e.g., including only a single vapor chamber). As a non-limiting example, in one or more embodiments, there may exist only a single heatsink (sharing a single vapor chamber with a single internal volume) that is disposed on both sides of PCB (320). Further, as another non-limiting example, two or more integrated circuits (the lidless integrated circuit (322) and other integrated circuit(s) (not shown)) may be disposed on the same and/or opposite sides of the PCB (320). That is, an integrated circuit (not shown) may be disposed where the gap pad (324) is shown and may make thermally conductive contact with vapor chamber C (312.3). Additionally, one or more integrated circuit(s) (not shown) may be offset from the center of the PCB (320) and disposed nearer to the edges of the PCB (320) than the lidless integrated circuit (322). Accordingly, embodiments disclosed herein should not be limited to the configuration of devices and/or components shown in FIG. 3A.

Figure 3B:
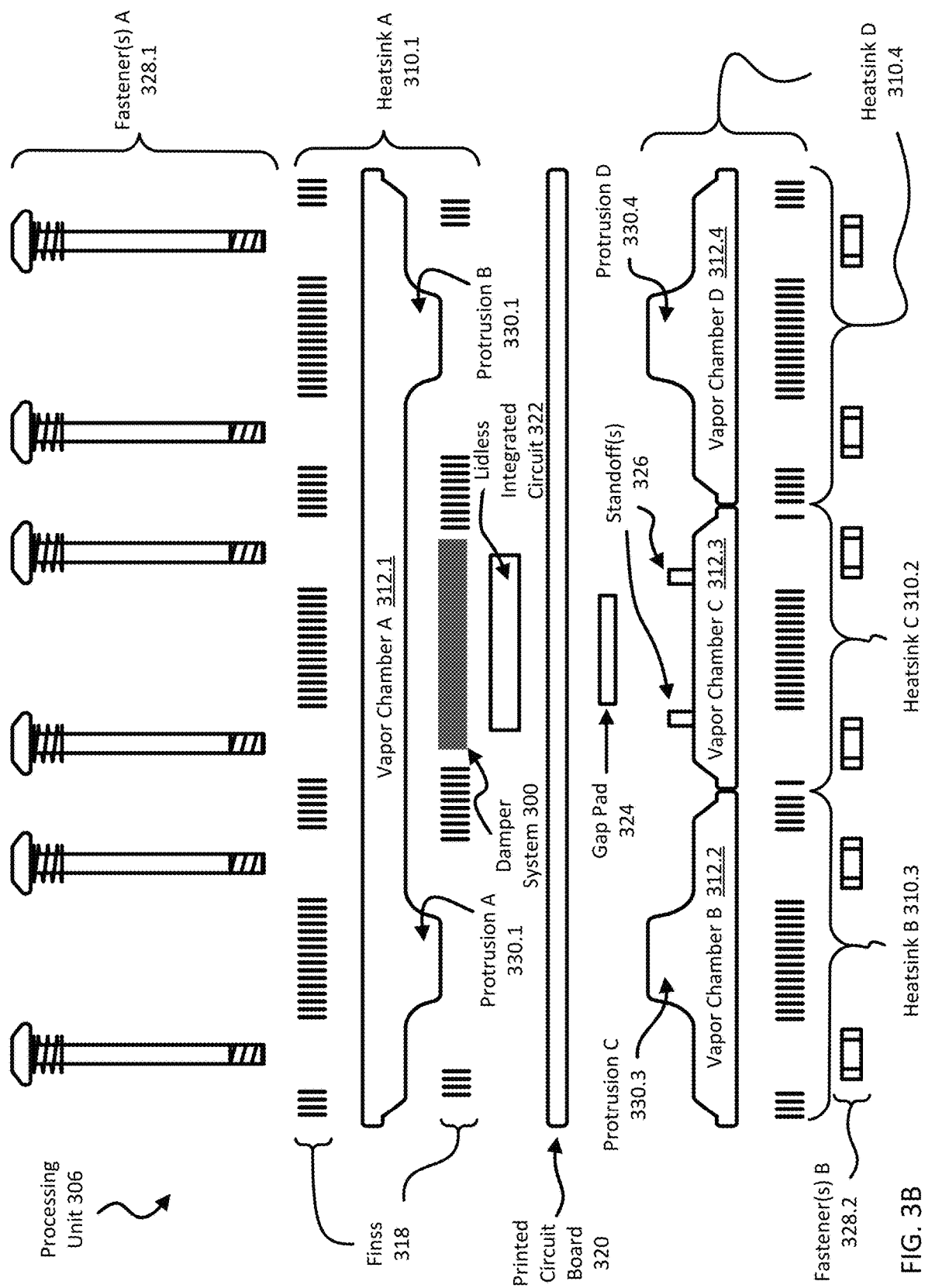
FIG. 3B shows an example of the components of a processing unit, in accordance with one or more embodiments.

FIG. 3B shows an example of the components of a processing unit separated apart, in accordance with one or more embodiments. Similarly named and/or similarly numbered components of FIG. 3B have all of the same properties as discussed in the description of FIG. 3A.

In one or more embodiments, as shown in FIG. 3B, a fastener (e.g., fastener(s) A (328.1), fastener(s) B (328.2)) may be constructed of two or more components. As a non-limiting example, as shown in FIG. 3B, fastener(s) A (328.1) are bolts and/or machine screws with external threads and fastener(s) B (328.2) are nuts with internal threads adapted to mechanically couple with fastener(s) A (328.1). One of ordinary skill in the art, having the benefit of this Detailed Description, would appreciate how mechanically coupling a nut and bolt through other components provides mechanical coupling to those other components.

While FIG. 3B shows an example of a processing unit, other configurations may be used without departing from the scope. Accordingly, embodiments disclosed herein should not be limited to the configuration of devices and/or components shown in FIG. 3B.

Figure 4A:
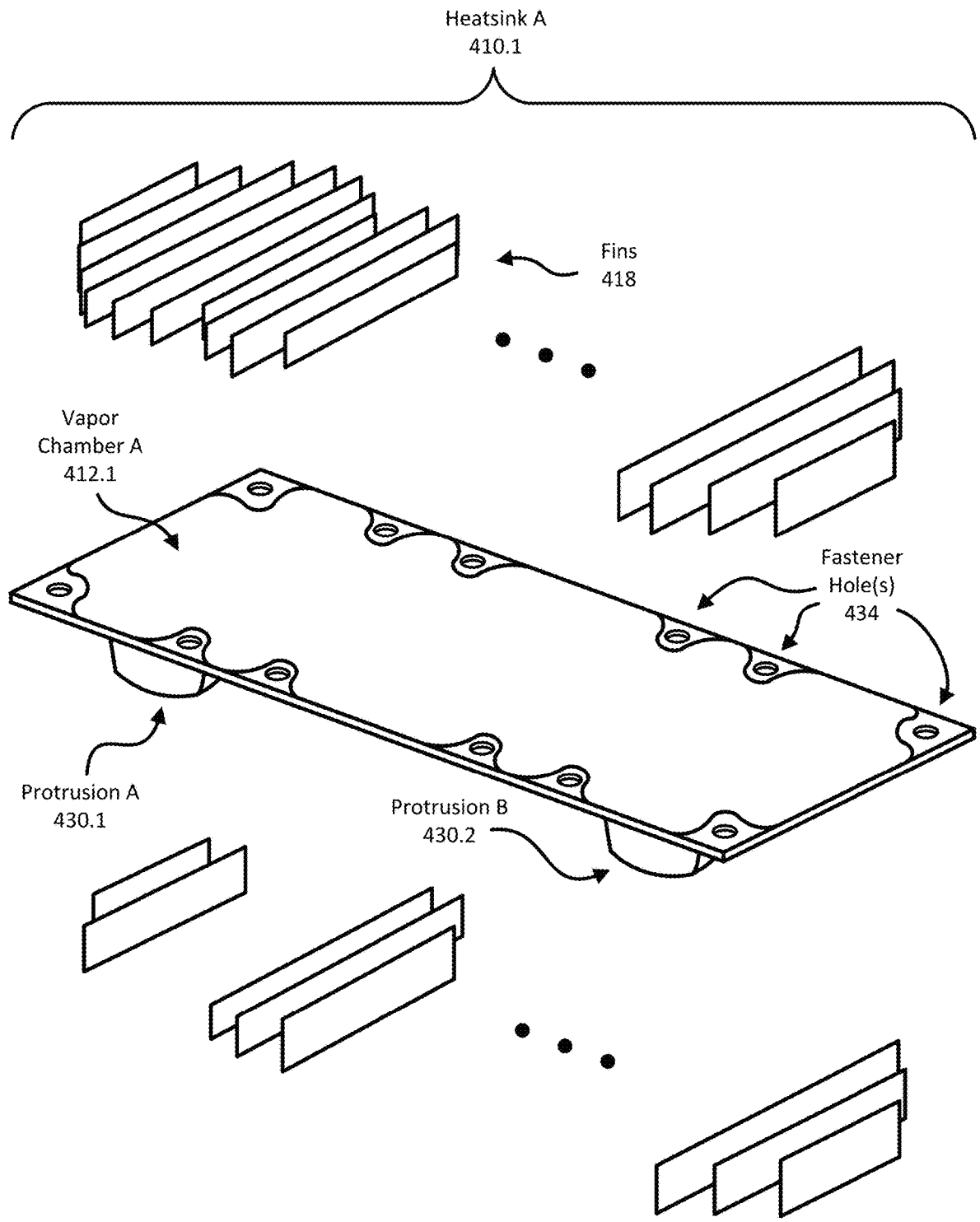
FIG. 4A shows an exploded view of an example of a heatsink, in accordance with one or more embodiments.

FIG. 4A shows an exploded view of an example of a heatsink, in accordance with one or more embodiments. In one or more embodiments, heatsink A (410.1) of FIG. 4A is similar to heatsink A (310.1) of FIGS. 3A and 3B. Accordingly, similarly named and/or similarly numbered components of FIG. 4A have all of the same properties as discussed in the description of FIGS. 3A and 3B. In one or more embodiments, heatsink A (410.1) includes fins (e.g., fins (418)), a vapor chamber (e.g., vapor chamber A (412.1)), one or more protrusions (e.g., protrusion A (430.1), protrusion B (430.2)), and one or more fastener hole(s) (e.g., fastener hole(s) (434)).

In one or more embodiments, a fastener hole (e.g., fastener hole(s) (434)) is a hole (e.g., an unobstructed opening) that traverses the thickness of a component (e.g., vapor chamber A (412.1)) and provides a pathway for one or more fastener(s) (not shown) to traverse the thickness of the component. Fastener hole(s) (434) may be vertically aligned with fastener hole(s) (not shown) of other components of the processing unit to enable one or more fastener(s) to traverse two or more components concurrently (and/or the processing unit as a whole). In one or more embodiments, the area around fastener hole(s) (434) may provide an area for vertical physical contact with a fastener (e.g., the underside of a screw head).

While FIG. 4A shows an example of a heatsink, other configurations may be used without departing from the scope. Accordingly, embodiments disclosed herein should not be limited to the configuration of devices and/or components shown in FIG. 4A.

Figure 4B:
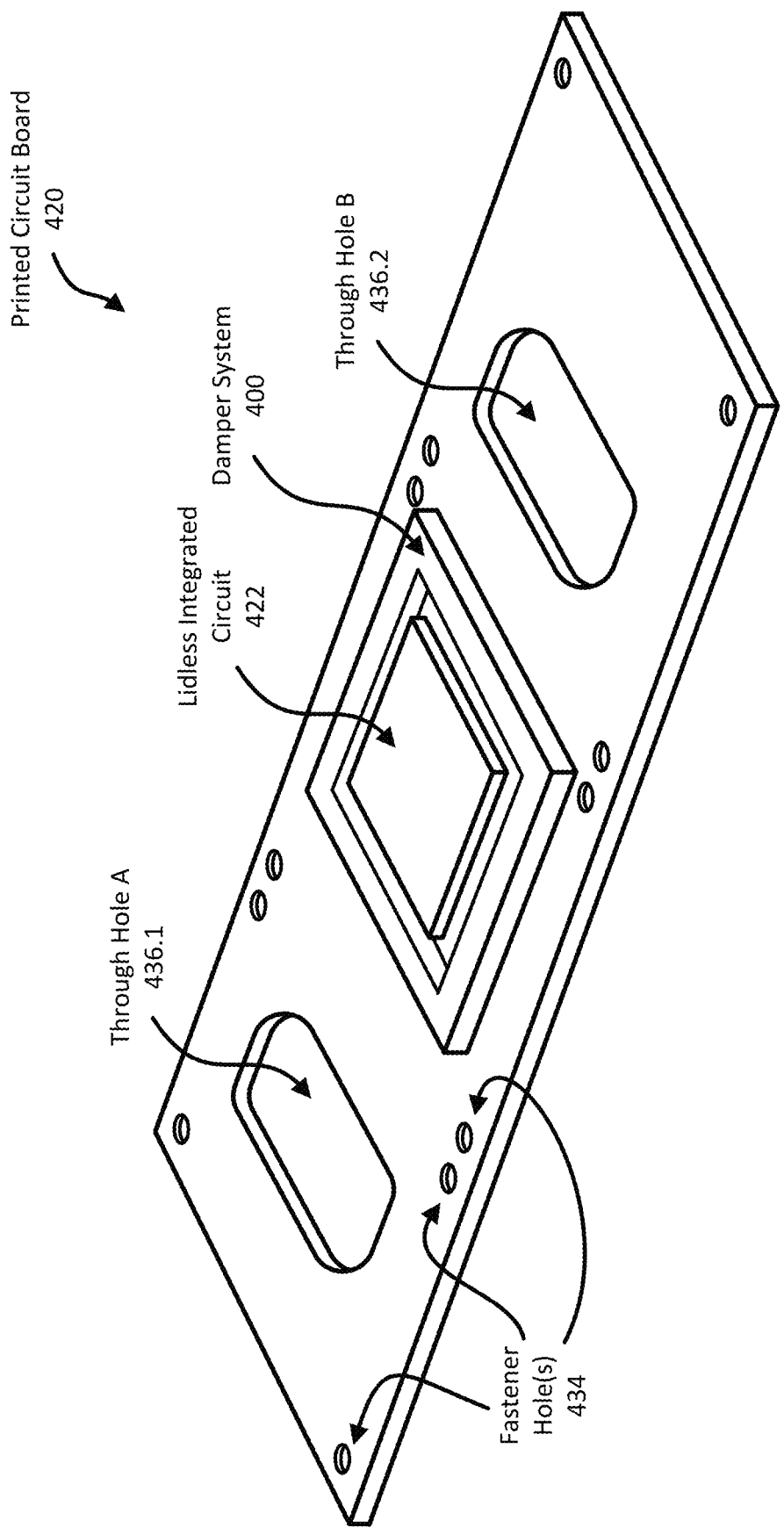
FIG. 4B shows an example of a printed circuit board, in accordance with one or more embodiments.

FIG. 4B shows an example of a PCB (420), in accordance with one or more embodiments. In one or more embodiments, the PCB (420) is similar to the PCB (320) of FIGS. 3A and 3B. Further, similarly named and/or similarly numbered components of FIG. 4B have all of the same properties as discussed in the description of FIGS. 3A, 3B, and 4A. In one or more embodiments, the PCB (420) includes a lidless integrated circuit (422), a damper system (400) one or more fastener hole(s) (e.g., fastener hole(s) (434)), one or more through holes (e.g., through hole A (436.1), through hole B (436.2)), and one or more TSVs (not shown).

In one or more embodiments, the damper system (400) is rectangular, as shown in FIG. 4B. In other embodiments, the damper system (400) may be circular, triangular, or any other shape as required to surround the lidless integrated circuit (422). Additionally, the damper system (400) may not be continuous around the lidless integrated circuit (400). As a non-limiting example, in one or more embodiments, the damper system (400) includes multiple sections and each section is aligned with a respective side of the lidless integrated circuit (422) and the sections are not joined together to form a continuous member. Additionally, in one or more embodiments, an adhesive may be used to hold the damper system 400 in position on either the PCB (420) or the heatsink (e.g., 310.1, FIG. 3.A) to aid in installation of the heatsink the heatsink (e.g., 310.1, FIG. 3.A) on the processing unit (e.g. 306, FIG. 3A)

In one or more embodiments, a through hole (e.g., through hole A (436.1), through hole B (436.2)) is hole (e.g., an unobstructed opening) that traverses the thickness of PCB (420) and allows for one or more protrusion(s) (not shown) to traverse therethrough. As a non-limiting example, protrusion B of heatsink B (not shown) may traverse and/or partially traverse through hole A (436.1) from the underside (the side opposite integrated circuit (422)) in order to establish a thermal contact with protrusion A of heatsink A (not shown) (which may also traverse and/or partially traverse through hole A (436.1)).

In one or more embodiments, TSVs (not shown) may be disposed throughout the PCB (420) and traverse the thickness of the PCB (420). Further, in one or more embodiments, TSVs may be more thermally conductive than other material(s) that compose the PCB (420) thereby allowing heat to transfer through the PCB (420) through the TSVs. Accordingly, the TSVs disposed in the PCB (420) under the lidless integrated circuit (422) may provide thermally conductive pathway through which heat is transferred from the lidless integrated circuit (422) to a gap pad (not shown) located beneath the PCB (420).

In one or more embodiments, protrusions may be of varying height, and therefore only a single protrusion may traverse a through hole (e.g., 436.1, 436.2). As a non-limiting example, protrusion B of heatsink B (not shown) may have greater height (i.e., vertical length) than protrusion A of heatsink A (not shown); thus, protrusion B of heatsink B (not shown) may traverse the entirety of through hole (436.1) and physically contact protrusion A of heatsink A at a height above the surface of the PCB (420).

While FIG. 4B shows an example of a PCB (420), other configurations may be used without departing from the scope. For example, although the PCB (420) is shown with two through holes (436.1, 436.2), a PCB may include only one through hole if only one protrusion (or protrusion couple) are present in the processing unit (similarly, a PCB may include three or more through holes that correspond to a respective number of protrusions). Further, as a non-limiting example, the through holes (436.1, 436.2) may be disposed at the edges of PCB (420) such that the through holes may only be notches (i.e., not encircled by PCB (420)) but still allow for one or more protrusion(s) to traverse the thickness of the PCB (420). Accordingly, embodiments disclosed herein should not be limited to the configuration of devices and/or components shown in FIG. 4B.

As articulated above, specific embodiments are described with reference to the accompanying figures. In the preceding description, numerous details were set forth as examples. One of ordinary skill in the art, having the benefit of this Detailed Description, would appreciate that one or more embodiments described above may be practiced without the explicitly articulated details, and that numerous variations or modifications may be possible without departing from the scope. For example, although the processing unit is shown to be generally rectangular, the processing unit may take any shape of the components from which it is constructed (e.g., an oval-shaped PCB, square heatsink(s), wavy-shaped fins, and/or any combination thereof). Further, one or more components of the processing unit may be differently sized than as shown in the accompanying figures (e.g., the PCB may extend beyond the footprint of the heatsinks, or the PCB may be much smaller (e.g., mostly covered by an integrated circuit) than the footprint of the heatsinks. Accordingly, certain details known to those of ordinary skill in the art may be omitted to avoid obscuring the description.

In the preceding description of the figures, any component described with regard to a figure, in various embodiments, may be equivalent to one or more like-named components shown and/or described with regard to any other figure. For brevity, descriptions of these components were not repeated with regard to each figure. Thus, each and every embodiment of the components of each figure is incorporated by reference and assumed to be optionally present within every other figure having one or more like-named components. Additionally, in accordance with various embodiments, any description of any component of a figure is to be interpreted as an optional embodiment, which may be implemented in addition to, in conjunction with, or in place of the embodiments described with regard to a corresponding like-named component in any other figure.

Throughout this application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the term 'operatively connected', or 'operative connection', means that there exists between elements/components/devices a direct or indirect connection that allows the elements to interact with one another in some way (e.g., via the exchange of information). For example, the phrase 'operatively connected' may refer to any direct (e.g., wired or wireless connection directly between two devices) or indirect (e.g., wired and/or wireless connections between any number of devices connecting the operatively connected devices) connection.

As used herein, a range that includes the term between is intended to include the upper and lower limits of the range; e.g., between 50 and 150 includes both 50 and 150. Additionally, the term "approximately" includes all values within 5% of the target value; e.g., approximately 100 includes all values from 95 to 105, including 95 and 105. Further, approximately between includes all values within 5% of the target value for both the upper and lower limits; e.g., approximately between 50 and 150 includes all values from 47.5 to 157.5, including 47.5 and 157.5.

While one or more embodiments have been described herein with respect to a limited number of embodiments and examples, one of ordinary skill in the art, having the benefit of this Detailed Description, would appreciate that other embodiments can be devised which do not depart from the scope of the embodiments disclosed herein. Accordingly, the scope should be limited only by the attached claims.

What is claimed is:

1. A processing unit comprising:
   a printed circuit board (PCB) having first and second opposite sides and comprising a lidless integrated circuit mounted on the first side of the PCB;
   a heatsink in thermal communication with the lidless integrated circuit via only one thermal interface material, wherein the heatsink includes a first vapor chamber on the first side of the PCB and a second vapor chamber on the second side of the PCB and wherein a protrusion of the first vapor chamber is thermally coupled to a protrusion of the second vapor chamber; and
   a damper system compressed between the PCB and the heatsink and surrounding the lidless integrated circuit to absorb a portion of kinetic energy imparted to the lidless integrated circuit by an impact to the processing unit, wherein the damper system comprises an elastomer material that contacts the heatsink.

2. The processing unit of claim 1, wherein a thickness of the damper system is within a range between approximately 1 mm and approximately 10 mm.

3. The processing unit of claim 1, wherein the damper system comprises multiple layers.

4. The processing unit of claim 3, wherein at least one layer of the multiple layers comprises a material that is different than a material of another layer of the multiple layers.

5. The processing unit of claim 1, wherein the damper system comprises multiple sections.

6. The processing unit of claim 5, wherein the lidless integrated circuit comprises multiple sides and each section of the multiple sections is aligned with a respective side of the lidless integrated circuit.

7. The processing unit of claim 1, wherein the elastomer material includes particles of another material.

8. The processing unit of claim 1, wherein the protrusion of the first vapor chamber is thermally coupled to the protrusion of the second vapor chamber via additional thermal interface material between the protrusion of the first vapor chamber and the protrusion of the second vapor chamber.

9. A compute unit comprising:
   a chassis; and
   a processing unit positioned within the chassis and comprising:
      a printed circuit board (PCB) having first and second opposite sides and comprising a lidless integrated circuit mounted on the first side of the PCB;
      a heatsink in thermal communication with the lidless integrated circuit via only one thermal interface material, wherein the heatsink includes a first vapor chamber on the first side of the PCB and includes a second vapor chamber on the second side of the PCB and wherein the second vapor chamber contacts the first vapor chamber;
      a damper system compressed between the PCB and the heatsink and surrounding the lidless integrated circuit to absorb a portion of kinetic energy imparted to the lidless integrated circuit by an impact to the processing unit; and
   an air mover unit positioned within the chassis and operable to flow air over the heatsink.

10. The compute unit of claim 9, wherein the damper system comprises multiple layers.

11. The compute unit of claim 10, wherein at least one layer of the multiple layers comprises a material that is different than a material of another layer of the multiple layers.

12. The compute unit of claim 9, wherein the damper system comprises multiple sections.

13. The compute unit of claim 12, wherein the lidless integrated circuit comprises multiple sides and each section of the multiple sections is aligned with a respective side of the lidless integrated circuit.

14. The compute unit of claim 9, wherein the damper system comprises an elastomer that includes particles of another material.

15. The compute unit of claim 9, wherein the second vapor chamber contacts the first vapor chamber via additional thermal interface material between the first vapor chamber and the second vapor chamber.

* * * * *